United States Patent [19]

Yoshida

[11] Patent Number: 4,864,255
[45] Date of Patent: Sep. 5, 1989

[54] OSCILLATOR CAPABLE OF QUICKLY SUPPLYING A STABLE OSCILLATION SIGNAL

[75] Inventor: Osamu Yoshida, Tokyo, Japan
[73] Assignee: NEC Corporation, Japan
[21] Appl. No.: 94,502
[22] Filed: Sep. 9, 1987
[30] Foreign Application Priority Data Sep. 9, 1986 [JP] Japan ................................. 61-213155

[51] Int. Cl.⁴ .............................................. H03B 5/36
[52] U.S. Cl. ................... 331/75; 331/116 FE; 331/158; 331/173
[58] Field of Search ........ 331/74, 75, 116 R, 116 FE, 331/158, 173; 328/59, 63, 115; 307/239, 264

[56] References Cited

U.S. PATENT DOCUMENTS 4,746,810 5/1988 Takahashi ................. 331/116 FE X

FOREIGN PATENT DOCUMENTS 54-152848 1/1979 Japan ............................ 331/116 FE
58-50803 3/1983 Japan ............................ 331/116 FE
58-165401 9/1983 Japan ................................... 331/74

Primary Examiner—Siegfried H. Grimm
Attorney, Agent, or Firm—Laff, Whitesel, Conte & Saret

[57] ABSTRACT

An oscillator has an oscillating circuit including a NOT circuit having first and second inputs and one output and is placed into an operable condition in response to a trigger signal applied to the first input of the NOT circuit. A frequency determining circuit is connected between the second input and the output of the NOT circuit so that the output of the NOT circuit generates an oscillation signal of a frequency which is determined by the frequency determining circuit. A comparator has a threshold level which is different from that of the NOT circuit and is connected to the output of the NOT circuit so as to generate a control signal when the oscillation signal exceeds the threshold of the comparator. Further, an output circuit is connected to the outputs of the oscillating circuit and the comparator for receiving the trigger signal for outputting the oscillating signal after the trigger signal is received and the control signal is generated.

18 Claims, 2 Drawing Sheets

OSCILLATOR CAPABLE OF QUICKLY SUPPLYING A STABLE OSCILLATION SIGNAL

BACKGROUND OF THE INVENTION

1. Field of the Invention

The present invention relates to an oscillator, and more particularly to an oscillator which can be used as a clock generator for use in a microcomputer.

2. Description of related art

Heretofore, microcomputers are usably incorporated with a clock oscillator of the type which includes a NOT circuit having an output thereof fed back to an input thereof through a frequency control circuit having a quartz-crystal resonator or a ceramic resonator, so that a signal of the frequency determined by the frequency control circuit is generated. This type of oscillator is very excellent in precision of oscillation frequency, but is not so good in starting characteristics. Briefly, a relatively long time is needed from the power-on to stabilization of the oscillation frequency. For example, if a ceramic resonator is used, it takes several milliseconds to several ten milliseconds for stabilization of frequency. In addition, during the start period, oscillation will occur at a frequency higher than a stabilized frequency.

If the above mentioned oscillator is used as a clock generator for a microcomputer, during a short time period just after the power-on, since a clock frequency will be higher than a stabilized clock frequency, the microcomputer will often malfunction. For example, error will occur in reading data from a read only memory. To avoid this problem, so-called "power-on-clear" method is used in which a microcomputer is reset when a predetermined period of time has elapsed from the power-on. However, this method is not suitable to a remote controlled computer which is demanded to minimize the consumed power. The remote controlled computer is ordinarily constructed such that a clock generator oscillates only when it receives an instruction from an external device, and a power supply for the microcomputer is turned on in response to the oscillation signal to cause the microcomputer to operate in synchronism with the oscillation clock, and then, the power supply is automatically turned off when the microcomputer has completed a required processing. Therefore, the power consumed from the power-on to the so-called "power-on-clear" is not negligible in minimizing the power consumption.

SUMMARY OF THE INVENTION

Accordingly, it is an object of the present invention to provide an oscillator which has overcome the above mentioned drawbacks of the conventional ones.

Another object of the present invention to provide an oscillator which will not output an oscillation signal until the oscillation frequency is stabilized.

The above and other objects of the present invention are achieved in accordance with the present invention by an oscillator comprising:

an oscillating circuit including a NOT circuit having first and second inputs and one output and placed into an operable condition in response to a trigger signal applied to the first input of the NOT circuit, and a frequency determining circuit connected between the second input and the output of the NOT circuit so that the output of the NOT circuit generates an oscillation signal of a frequency determined by the frequency determining circuit;

a control circuit connected to the output of the NOT circuit for generating a control signal when the oscillation signal exceeds a threshold level different from that of the NOT circuit; and an output circuit connected to receive the oscillation signal and the control signal and also to receive the trigger signal for outputting the oscillating signal after the trigger signal is received and the control signal is generated.

With the above arrangement, since the control circuit compares the oscillation signal with the threshold different from that of the NOT circuit of the oscillating circuit, the control circuit can detect the fact that the oscillation signal has had a sufficiently large amplitude or magnitude and hence a stabilized frequency. Therefore, the output circuit which is adapted to output the oscillation signal after it receives the control signal, will stop the output of the oscillation signal if the frequency has not yet been stabilized although the trigger signal is supplied. Accordingly, the output circuit will output only a signal having a stabilized frequency from its first output signal.

In one embodiment, the NOT circuit of the oscillating circuit includes a source-grounded first MOS transistor of the n-channel type having a drain connected to the output of the oscillating circuit and a second MOS transistor of the p-channel type having a drain connected to the drain of the first MOS transistor and a source connected to a drain supply voltage. A gate of the second MOS transistor is connected to receive the trigger signal, and the drain of the first MOS transistor is connected to a gate of the first MOS transistor itself through the frequency determining circuit.

Further, the frequency determining circuit includes a parallel circuit composed of a piezo resonator such as a ceramic resonator and a quartz-crystal resonator and a resistor and connected at its opposite ends to the gate and the drain of the first MOS transistor of the NOT circuit, respectively. Each end of the parallel circuit is grounded through a capacitor.

In addition, the control circuit includes a second NOT circuit having a threshold voltage higher than that of the first NOT circuit. An input of the second NOT circuit is connected to the output of the oscillating circuit, and an output of the second NOT circuit is connected to the output circuit.

Specifically, the second NOT circuit includes a source-grounded third MOS transistor of the n-channel type having a gate connected to the output of the first NOT circuit and a drain connected to the output circuit, and a gate-grounded fourth MOS transistor of the p-channel type connected between the drain of the third transistor and a drain supply voltage. The third transistor has a threshold voltage larger than that of the first NOT circuit so as to generate the control signal when the oscillation signal exceeds the threshold voltage of the third transistor.

The output circuit includes a frequency dividing means receiving the control signal for generating a second control signal when it receives a predetermined number of the first control signals, and a gate means receiving the oscillation signal and controlled by the second control signal to output the oscillation signal after the second control signal is received.

The frequency dividing means includes a first NOT gate having an input connected to receive the control signal, and a second NOT gate having an input connected to an output of the first NOT gate, a first flipflop having a pair of clock inputs connected to the outputs of the first and second NOT gates, respectively and a reset input connected to receive the trigger signal, a second flipflop having a pair of clock inputs connected to Q and $\overline{Q}$ outputs of the first flipflop, respectively and a reset input connected to receive the trigger signal, an AND circuit having a pair of inputs connected to the Q outputs of the first and second flipflops, and a R-S flipflop having a pair of inputs connected to receive an output of the AND gate and the trigger signal. The R-S flipflop generates the second control signal.

Specifically, the above gate means includes a NAND gate having a first input connected to receive the oscillation signal and a second input connected to receive the second control signal.

Preferably, the oscillator further includes a waveform shaping means provided between the oscillating circuit and the gate means to supply a pulse having the same frequency as that of the oscillating signal and a duty ratio of 50%.

The above waveform shaping means includes a third NOT circuit having a threshold voltage substantially equal to that of the first NOT circuit. An input of the third NOT circuit is connected to the output of the oscillating circuit and an output of the third NOT circuit is connected to the gate means.

Specifically, the third NOT circuit includes a source-grounded fifth MOS transistor of the n-channel type having a gate connected to the output of the first NOT circuit and a drain connected to the output circuit, and a gate-grounded sixth MOS transistor of the p-channel type connected between the drain of the fifth transistor and a drain supply voltage. The fifth transistor has a threshold voltage substantially equal to that of the first NOT circuit.

In accordance with another aspect of the present invention, there is provided an oscillator comprising:

an oscillating circuit including a NOT circuit having first and second inputs and one output and placed into an operable condition in response to a trigger signal applied to the first input of the NOT circuit, and a frequency determining circuit connected between the second input and the output of the NOT circuit so that the output of the NOT circuit generates an oscillation signal of a frequency determined by the frequency determining circuit;

a control circuit connected to the output of the NOT circuit for generating a first control signal when the oscillation signal exceeds a threshold level different from that of the NOT circuit and for frequency-dividing the first control signal so as to output a second control signal when a predetermined number of the first control signals have been generated; and an output circuit connected to receive the oscillation signal and the second control signal for outputting the oscillating signal after the second control signal is generated.

In accordance with a third aspect of the present invention, there is provided an oscillator comprising:

an oscillating circuit including a NOT circuit having first and second inputs and one output and placed into an operable condition in response to a trigger signal applied to the first input of the NOT circuit, and a frequency determining circuit connected between the second input and the output of the NOT circuit so that the output of the NOT circuit generates an oscillation signal of a frequency determined by the frequency determining circuit;

a second NOT circuit having a threshold voltage higher than that of the first NOT circuit, and an input thereof connected to the output of the oscillating circuit, the second NOT circuit generating a control signal when the oscillation signal exceeds the threshold voltage;

a frequency dividing means receiving the control signal for generating a second control signal when it receives a predetermined number of the first control signals;

a waveform shaping means connected to the output of the oscillating circuit to supply a pulse signal having the same frequency as that of the oscillating signal; and a gate means receiving the pulse signal and controlled by the second control signal to output the pulse signal after the second control signal is received.

The above and other objects, features and advantages of the present invention will be apparent from the following description of the preferred embodiment of the invention with reference to the accompanying drawings.

DESCRIOPTION OF THE PREFERRED EMBODIMENT

Figure 1:
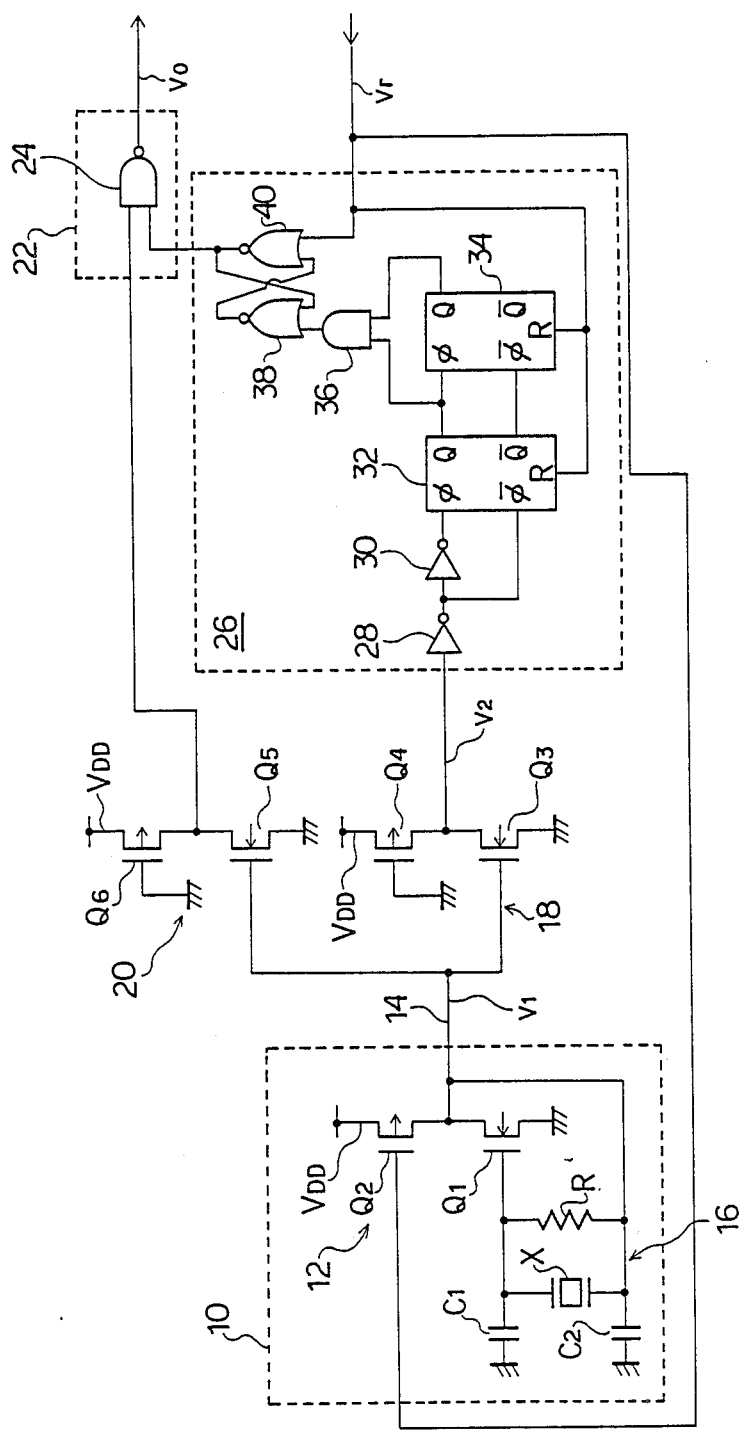
FIG. 1 is a circuit diagram of one embodiment of the oscillator constructed in accordance with the present invention.

Referring to FIG. 1, the shown embodiment of the oscillator in accordance with the present invention comprises an oscillating circuit 10 which includes a NOT circuit 12 composed of a source-grounded n-channel MOS transistor $Q_1$ having a drain connected to an output 14 of the oscillating circuit 10, and a p-channel MOS transistor $Q_2$ having a drain connected to the drain of the transistor $Q_1$ and a gate connected to receive a trigger signal or reset signal Vr. A source of the transistor $Q_2$ is connected to a drain supply voltage $V_{DD}$. The drain of the transistor $Q_1$ is connected to a gate of the transistor $Q_1$ itself through a parallel circuit composed of a resistor R and a ceramic resonator X. Opposite ends of the ceramic resonator X are grounded through capacitors $C_1$ and $C_2$, respectively.

Thus, if the reset signal Vr of a low level is supplied to the gate of the transistor $Q_2$ so as to put the transistor $Q_2$ in a conductive condition, the circuit composed of the transistor $Q_1$ and the ceramic resonator will start oscillation of an alternating signal at a frequency corresponding to a resonant frequency of the ceramic resonator X. The oscillation signal has a center voltage corresponding to a threshold voltage $V_{TH1}$ of the transistor $Q_1$ and the amplitude of the oscillation signal will gradually increase to a voltage corresponding to a difference between the source supply voltage $V_{DD}$ and the ground potential. In this operation, the resistor R determines an operating point of the gate of the transistor $Q_1$, and the capacitors $C_1$ and $C_2$ function for a fine adjustment and a temperature compensation of the oscillation frequency and for prevention of parasitic oscillation. In other words, the ceramic resonator X, the resistor R and the capacitors $C_1$ and $C_2$ constitute a frequency determining circuit 16.

To the contrary, if the reset signal of a high level is inputted to the gate of the transistor $Q_2$, the transistor $Q_2$ is brought into off condition, and so, the oscillating circuit 10 will stop the oscillation. A quartz crystal resonator can be used in place of the ceramic resonator X.

The output 14 of the oscillating circuit 10 is connected to a second NOT circuit 18, which is in turn composed of a source grounded n-channel MOS transistor $Q_3$ having a gate connected to the output 14 of the oscillating circuit 10. A drain of the transistor $Q_3$ is connected to a drain of a gate-grounded p-channel MOS transistor $Q_4$ having a source connected to a drain supply voltage $V_{DD}$. Namely, the transistor $Q_4$ is provided as a load for the transistor $Q_3$. The drain of the transistor $Q_3$ constitutes an output of the second NOT circuit 18. The transistor $Q_3$ has a threshold voltage $V_{TH2}$ higher than the threshold $V_{TH1}$ of the transistor $Q_1$. In other words, the second NOT circuit is designed to have a threshold voltage higher than that of the first NOT circuit 12. Therefore, the second NOT circuit 18 outputs a low level signal when the voltage of the oscillation signal $V_1$ outputted from the oscillating circuit 10 is higher than the threshold $V_{TH2}$ of the NOT circuit 18 itself. Accordingly, the second NOT circuit 18 functions as a comparator which compares the voltage of the oscillation signal $V_1$ with the threshold $V_{TH2}$ of the NOT circuit 18 which is higher than the center voltage $V_{TH1}$ of the oscillation signal $V_1$.

Furthermore, the output 14 of the oscillating circuit 10 is connected to a third NOT circuit 20, which is composed of a source grounded n-channel MOS transistor $Q_5$ having a gate connected to the output 14 of the oscillating circuit 10. The transistor $Q_5$ is connected at its drain to a drain of a gate-grounded p-channel MOS transistor $Q_6$ having a source connected to a drain supply voltage $V_{DD}$. Therefore, the transistor $Q_6$ forms a load for the transistor $Q_5$. The drain of the transistor $Q_5$ constitutes an output of the third NOT circuit 20. The transistor $Q_5$ has the same threshold voltage as the threshold $V_{TH1}$ of the transistor $Q_1$ so that the third NOT circuit 20 has a threshold voltage substantially equal to that of the first NOT circuit 12. Thus, the third NOT circuit 20 outputs a low level signal when the voltage of the oscillation signal $V_1$ outputted from the oscillating circuit 10 is higher than the threshold of the NOT circuit 20, namely the center voltage $V_{TH1}$ of the oscillation signal itself, and a high level signal when the voltage of the oscillation signal $V_1$ is not higher than the center voltage $V_{TH1}$ of the oscillation signal. In other words, the third NOT circuit 20 functions as a waveform shaper which shapes the oscillation signal $V_1$ with reference to the threshold of the NOT circuit 20 so as to generate a pulse signal.

The output of the third NOT circuit 20 is connected to an output circuit 22, which includes a NAND circuit 24. This NAND circuit 24 has a first input connected to the drains of the transistors $Q_5$ and $Q_6$ and an output constitutes an output $V_o$ of the oscillator.

The output of the second NOT circuit 18 is connected to a control circuit 26, which in turn comprises two cascaded NOT gates 28 and 30. Outputs of the two NOT gates 28 and 30 are connected to a pair of clock inputs $\phi$ and $\bar{\phi}$ of a flipflop 32, respectively. A pair of outputs Q and $\bar{Q}$ of the flipflop 32 are connected to a pair of clock inputs $\phi$ and $\bar{\phi}$ of another flipflop 34, respectively. Each reset input of the two flipflops 32 and 34 is connected to receive the reset signal $V_r$. Thus, the two NOT gates 28 and 30 and the two flipflops 32 and 34 constitute a frequency divider, and when the reset signal Vr is at a high level, the frequency divider is maintained in a reset condition so that both the Q outputs of the flipflops 32 and 34 generate a low level signal. The respective Q outputs of the flipflops 32 and 34 are connected to a pair of inputs of an AND gate 36, whose output is connected to one input of a NOR gate 38. Another input of the NOR gate 38 is connected to an output of a second NOR gate 40 and on output of the NOR gate 38 is connected to one input of the second NOR gate 40. Another input of the second NOR gate 40 is connected to receive the reset signal $V_r$ and the output of the NOR gate 40 is connected to a second input of the NAND gate 24. Thus, the two NOR gates 38 and 40 form a R-S flipflop.

Figure 2:
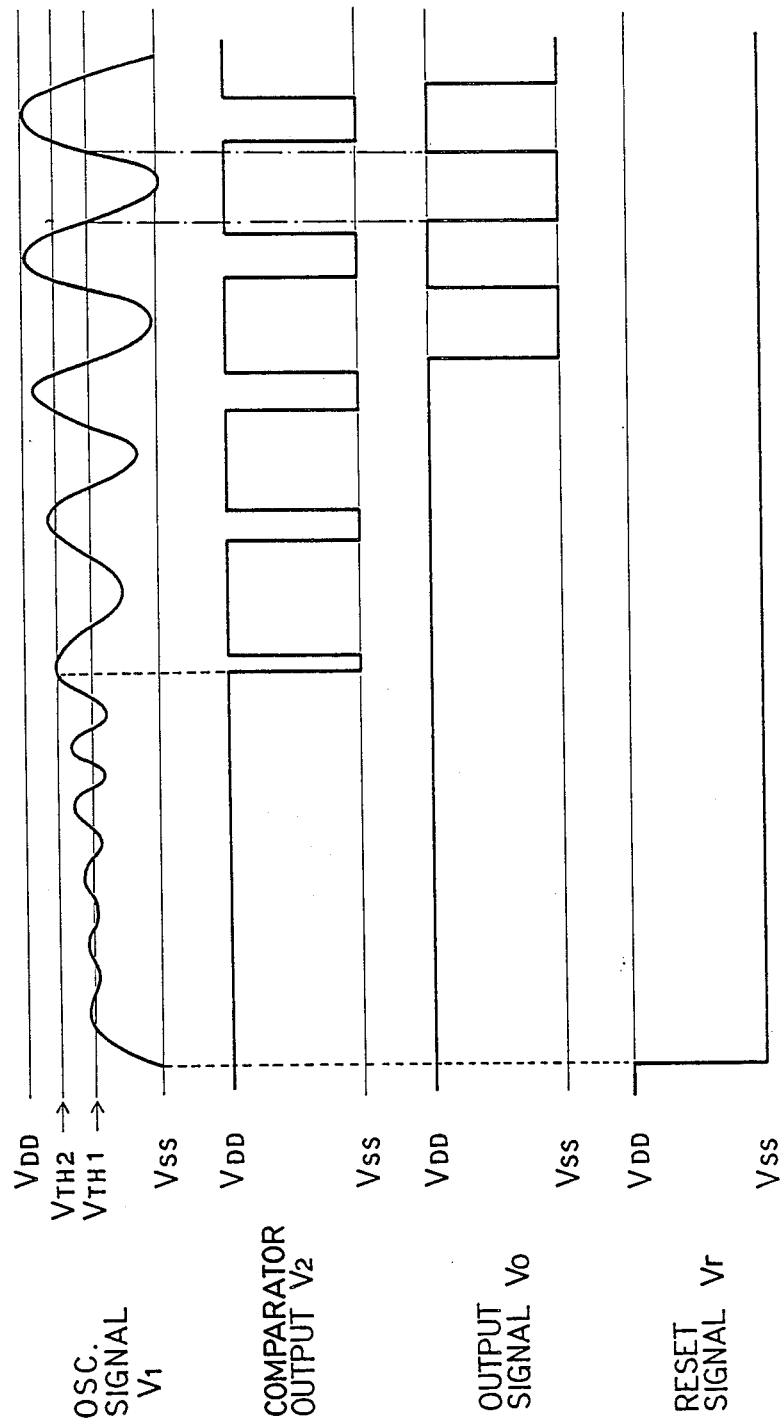
FIG. 2 is a diagram illustrating waveforms of signals at various points in the circuit shown in FIG. 1.

Now, a description will be made of an operation of the oscillator shown in FIG. 1 with reference to FIG. 2 illustrating waveforms of signals appearing at some points in the circuit of FIG. 1. In FIG. 2, the voltage $V_{ss}$ indicates the ground potential.

If the reset signal $V_r$ is at the voltage $V_{DD}$, since the transistor $Q_2$, which acts as a load for the transistor $Q_1$, is in an off condition, the oscillating circuit 10 will not oscillate. In addition, if the reset signal $V_r$ is at the voltage $V_{DD}$, i.e., at a high level, the NOR gate 40 outputs a low level signal to the NAND gate 24 so that the output of the NAND gate 24 is maintained at a high level. In other words, the NAND gate 24 is in a blocked condition.

If the reset signal $V_r$ is changed into the voltage $V_{ss}$, i.e., a low level, the transistor $Q_2$ is turned on so as to act as the load for the transistor $Q_1$. Therefore, the first NOT circuit 12 becomes operable, so that the output signal $V_1$ of the NOT circuit 12 is fed back to the input of the NOT circuit 12 (the gate of the transistor $Q_1$) through the ceramic resonator X of the frequency determining circuit 16. Thus, the oscillating circuit 10 starts oscillation at the resonant frequency of the ceramic resonator X.

The magnitude of the oscillation signal $V_1$ gradually increases, as shown in FIG. 2. A center voltage of the oscillation signal $V_1$ corresponds to the threshold voltage $V_{TH1}$ of the first NOT circuit 12. During a period in which the magnitude of the oscillation signal $V_1$ is gradually increasing, the oscillation frequency will often become higher than the stabilized frequency. If the amplitude of the oscillation signal $V_1$ sufficiently increases and the oscillation frequency is stabilized, the peak voltage of the oscillation signal $V_1$ will then exceed the threshold voltage $V_{TH2}$ of the second NOT circuit 18, and the second NOT circuit 18 will generate a negative going pulse $V_2$ having a pulse width corresponding to the time period in which the oscillation signal $V_1$ is higher than the threshold voltage $V_{TH2}$ of the second NOT circuit 18, as shown in FIG. 2. As mentioned above, since the threshold voltage $V_{TH2}$ of the second NOT circuit 18 is set to be different from (in this embodiment, higher than) the center voltage of the oscillation signal $V_1$ corresponding to the threshold voltage $V_{TH1}$ of the first NOT circuit 12, it can be detected from the output of the second NOT circuit 18 that the oscillation frequency has been stabilized.

The output pulse $V_2$ of the second NOT circuit 18 is supplied to the control circuit 26. The flipflops 32 and 34 of the control circuit 26 are maintained in a reset condition when the reset signal $V_r$ is at the voltage $V_{DD}$ (a high level), and therefore, the Q outputs of these flipflops are at a low level. When the reset signal $V_r$ is changed into the voltage $V_{ss}$, i.e., a low level, the flipflops 32 and 34 are rendered operable so as to function as the frequency divider. Namely, the flipflop 32 outputs ½-frequency divided signals from its Q and $\overline{Q}$ outputs, and the flipflop 34 outputs ¼-frequency divided signals from its Q and $\overline{Q}$ outputs. As a result, just after the reset signal $V_r$ is brought to the low level, the Q outputs of the flipflops 32 and 34 are maintained at a low level of "0". Namely, the output of the AND gate 36 is maintained at a low level of "0". At this time, therefore, the output of the NOR gate 40 is maintained at the low level. Namely, the NAND gate 24 is still maintained in the closed condition.

Thereafter, when three pulses $V_2$ have been inputted to the control circuit 26, both the Q outputs of the flipflops 32 and 34 are brought into a high level of "1", so that the output of the AND gate 36 changes from "0" to "1". Thus, the NOR gate 38 outputs a low level signal and therefore the NOR gate 40 will output a high level signal to the NAND gate 24 so as to open the NAND gate 24.

Accordingly, during the period from the moment the reset signal $V_r$ is changed into the voltage $V_{ss}$ before the moment the output of the AND gate 36 is brought to "1", the output of the NOR gate 40 is maintained at "0", and thereafter, once the output of the AND gate 36 brought to "1", the output of the NOR gate 40 is maintained at "1" regardless of alternation in the output level of the AND gate 36. In conclusion, the control circuit 26 will continue to output the signal of "0" after the reset signal $V_r$ is brought to the voltage $V_{ss}$, i.e., after the reset condition is removed, before the three pulses $V_2$ have been inputted, and thereafter, will continue to output the signal of "1".

As mentioned above, since the third NOT circuit 20 has the same threshold voltage as that of the first NOT circuit 12, the third NOT circuit 20 will generate a pulse having the same frequency as the oscillation signal $V_1$ and the duty ratio of 50%. This pulse outputted from the third NOT circuit 20 is passed as the output pulse $V_o$ when the NAND gate 24 is opened. In other words, the NAND gate 24 receives the output of the control circuit 26 as a control signal so that the NAND circuit 24 will block the output of the third NOT circuit 20 while the output of the control circuit 26 is maintained at "0". However, if the output of the control circuit 26 is brought to "1", the NAND gate 24 will allow the output of the third NOT circuit 20 to pass therethrough in the form of an inverted signal.

As is apparent from the above description, the embodiment will output the pulse $V_o$ after the second NOT circuit 20 has generated three pulses. At this time, the oscillation signal $V_1$ has already had a sufficiently magnified amplitude and a stabilized frequency. Therefore, the output pulse $V_o$ generated from the shown oscillator in response to the reset signal $V_r$ will have a stabilized frequency from its first output pulse.

The invention has thus been shown and described with reference to the specific embodiment. However, it should be noted that the invention is in no way limited to the details of the illustrated structures but changes and modifications may be made within the scope and spirit of the present invention.

In the above mentioned embodiment, the third NOT circuit 20 is provided for obtaining a pulse of the duty ratio of 50%. Therefore, if the duty ratio of 50% is not required, the third NOT circuit 20 can be omitted.

Furthermore, the control circuit 26 is not limited to the construction shown in FIG. 1. For example, if the output of the NOT gate 28 is directly connected to the input of the NOR gate 38, when the second NOT circuit 18 outputs a first pulse, the NAND gate 24 will output the output pulse $V_o$.

I claim:
1. An oscillator comprising:
an oscillating circuit including a NOT circuit having first and second inputs and one output and placed into an operable condition in response to a trigger signal applied to the first input of the NOT circuit, and a frequency determining circuit connected between the second input and the output of the NOT circuit so that the output of the NOT circuit generates an oscillation signal of a frequency determined by the frequency determining circuit;
a control circuit connected to the output of the NOT circuit for generating a control signal when the oscillation signal exceeds a threshold level which is different from that of the NOT circuit;
an output circuit connected to receive the oscillation signal and the control signal and also to receive the trigger signal for outputting the oscillating signal after the trigger signal is received and the control signal is generated, the control circuit including a second NOT circuit having a threshold voltage higher than that of the first NOT circuit, an input of the second NOT circuit being connected to the output of the oscillating circuit and an output of the second NOT circuit being connected to the output circuit, the second NOT circuit including a source-grounded third MOS transistor of the n-channel type having a gate connected to the output of the first NOT circuit and a drain connected to the output circuit, and a gate-grounded fourth MOS transistor of the p-channel type connected between the drain of the third transistor and a drain supply voltage, the third transistor having a threshold voltage larger than that of the first NOT circuit so as to generate the control signal when the oscillation signal exceeds the threshold voltage of the third transistor.

2. An oscillator claimed in claim 1 wherein the NOT circuit of the oscillating circuit includes a source-grounded first MOS transistor of the n-channel type having a drain connected to the output of the oscillating circuit and a second MOS transistor of the p-channel type having a drain connected to the drain of the first MOS transistor and a source connected to a drain supply voltage, a gate of the second MOS transistor being connected to receive the trigger signal, and the drain of the first MOS transistor being connected to a gate of the first MOS transistor itself through the frequency determining circuit.

3. An oscillator claimed in claim 2 wherein the frequency determining circuit includes a parallel circuit composed of a piezo resonator and a resistor and connected at its opposite ends to the gate and the drain of the first MOS transistor of the NOT circuit, respectively, and each end of the parallel circuit being grounded through a capacitor.

4. An oscillator comprising:
an oscillating circuit including a NOT circuit having first and second inputs and one output and placed into an operable condition in response to a trigger signal applied to the first input of the NOT circuit, and a frequency determining circuit connected between the second input and the output of the NOT circuit so that the output of the NOT circuit generates an oscillation signal of a frequency determined by the frequency determining circuit;

a control circuit connected to the output of the NOT circuit for generating a control signal when the oscillation signal exceeds a threshold level which is different from that of the NOT circuit;

an output circuit connected to receive the oscillation signal and the control signal and also to receive the trigger signal for outputting the oscillating signal after the trigger signal is received and the control signal is generated, the output circuit including a frequency dividing means receiving the control signal for generating a second control signal when it receives a predetermined number of the first control signals, and a gate means receiving the oscillation signal and controlled by the second control signal to output the oscillation signal after the second control signal is received.

5. An oscillator claimed in claim 4 wherein the frequency dividing means includes a first NOT gate having an input connected to receive the control signal, and a second NOT gate having an input connected to an output of the first NOT gate, a first flipflop having a pair of clock inputs connected to the outputs of the first and second NOT gates, respectively and a reset input connected to receive the trigger signal, a second flipflop having a pair of clock inputs connected to Q and $\overline{Q}$ outputs of the first flipflop, respectively and a reset input connected to receive the trigger signal, an AND circuit having a pair of inputs connected to the Q outputs of the first and second flipflops, and a R-S flipflop having a pair of inputs connected to receive an output of the AND circuit and the trigger signal, the R-S flipflop being adapted to generate the second control signal.

6. An oscillator claimed in claim 4 wherein the gate means includes a NAND gate having a first input connected to receive the oscillation signal and a second input connected to receive the second control signal.

7. An oscillator claimed in claim 4 further including a waveform shaping means provided between the oscillating circuit and the gate means to supply a pulse having the same frequency as that of the oscillating signal and a duty ratio of 50%.

8. An oscillator claimed in claim 7 wherein the waveform shaping means includes a third NOT circuit having a threshold voltage substantially equal to that of the first NOT circuit, an input of the third NOT circuit being connected to the output of the oscillating circuit and an output of the third NOT circuit being connected to the gate means.

9. An oscillator claimed in claim 8 wherein the third NOT circuit includes a source-grounded fifth MOS transistor of the n-channel type having a gate connected to the output of the first NOT circuit and a drain connected to the output circuit, and a gate-grounded sixth MOS transistor of the p-channel type connected between the drain of the fifth transistor and a drain supply voltage, the fifth transistor having a threshold voltage substantially equal to that of the first NOT circuit.

10. An oscillator comprising:
an oscillating circuit including a NOT circuit having first and second inputs and one output and placed into an operable condition in response to a trigger signal applied to the first input of the NOT circuit, and a frequency determining circuit connected between the second input and the output of the NOT circuit so that the output of the NOT circuit generates an oscillation signal of a frequency determined by the frequency determining circuit;

a second NOT circuit having a threshold voltage which is higher than that of the first NOT circuit, and an input thereof connected to the output of the oscillating circuit, the second NOT circuit generating a control signal when the oscillation signal exceeds the threshold voltage;

a frequency dividing means receiving the control signal for generating a second control signal when it receives a predetermined number of the first control signals;

a waveform shaping means connected to the output of the oscillating circuit to supply a pulse signal having the same frequency as that of the oscillating signal; and a gate means receiving the pulse signal and controlled by the second control signal to output the pulse signal after the second control signal is received.

11. An oscillator claimed in claim 10 wherein the NOT circuit of the oscillating circuit includes a source-grounded first MOS transistor of the n-channel type having a drain connected to the output of the oscillating circuit and a second MOS transistor of the p-channel type having a drain connected to the drain of the first MOS transistor and a source connected to a drain supply voltage, a gate of the second MOS transistor being connected to receive the trigger signal, and the drain of the first MOS transistor being connected to a gate of the first MOS transistor itself through the frequency determining circuit.

12. An oscillator claimed in claim 11 wherein the frequency determining circuit includes a parallel circuit composed of a piezo resonator and a resistor and connected at its opposite ends to the gate and the drain of the first MOS transistor of the NOT circuit, respectively, and each end of the parallel circuit being grounded through a capacitor.

13. An oscillator claimed in claim 10 wherein the second NOT circuit includes a source-grounded third MOS transistor of the n-channel type having a gate connected to the output of the first NOT circuit and a drain connected to the frequency dividing means, and a gate-grounded fourth MOS transistor of the p-channel type connected between the drain of the third transistor and a drain supply voltage, the third transistor having a threshold voltage larger than that of the first NOT circuit so as to generate the control signal when the oscillation signal exceeds the threshold voltage of the third transistor.

14. An oscillator claimed in claim 10 wherein the frequency dividing means includes a first NOT gate having an input connected to receive the control signal, and a second NOT gate having an input connected to an output of the first NOT gate, a first flipflop having a pair of clock inputs connected to the outputs of the first and second NOT gates, respectively and a reset input connected to receive the trigger signal, a second flipflop having a pair of clock inputs connected to Q and $\overline{Q}$ outputs of the first flipflop, respectively and a reset input connected to receive the trigger signal, an AND circuit having a pair of inputs connected to the Q outputs of the first and second flipflops, and a R-S flipflop having a pair of inputs connected to receive an output of the AND circuit and the trigger signal, the R-S flipflop being adapted to generate the second control signal.

15. An oscillator claimed in claim 14 wherein the gate means includes a NAND gate having a first input connected to receive the pulse signal and a second input connected to receive the second control signal.

16. An oscillator claimed in claim 10 wherein the waveform shaping means includes a third NOT circuit having a threshold voltage substantially equal to that of the first NOT circuit, an input of the third NOT circuit being connected to the output of the oscillating circuit and an output of the third NOT circuit being connected to the gate means.

17. An oscillator claimed in claim 16 wherein the third NOT circuit includes a source-grounded fifth MOS transistor of the n-channel type having a gate connected to the output of the first NOT circuit and a drain connected to the gate means, and a gate-grounded sixth MOS transistor of the p-channel type connected between the drain of the fifth transistor and a drain supply voltage, the fifth transistor having a threshold voltage substantially equal to that of the first NOT circuit.

18. An oscillator comprising:
an oscillating circuit including a NOT circuit having first and second inputs and one output and placed into an operable condition in response to a trigger signal applied to the first input of the NOT circuit, and a frequency determining circuit connected between the second input and the output of the NOT circuit so that the output of the NOT circuit generates an oscillation signal of a frequency determined by the frequency determining circuit;
a control circuit connected to the output of the NOT circuit for generating a first control signal when the oscillation signal exceeds a threshold level which is different from that of the NOT circuit and for frequency-dividing the first control signal so as to output a second control signal when a predetermined number of the first control signals have been generated; and
an output circuit connected to receive the oscillation signal and the second control signal for outputting the oscillating signal after the second control signal is generated.

* * * * *